United States Patent
Mawst et al.

(10) Patent No.: US 9,093,821 B2
(45) Date of Patent: Jul. 28, 2015

(54) SUBSTRATE-EMITTING TRANSVERSE MAGNETIC POLARIZED LASER EMPLOYING A METAL/SEMICONDUCTOR DISTRIBUTED FEEDBACK GRATING FOR SYMMETRIC-MODE OPERATION

(71) Applicant: Wisconsin Alumni Research Foundation, Madison, WI (US)

(72) Inventors: Luke J. Mawst, Sun Prairie, WI (US); Dan Botez, Madison, WI (US); Thomas L. Earles, Verona, WI (US); Jeremy D. Kirch, Fitchburg, WI (US); Christopher A. Sigler, Fitchburg, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 14/103,223

(22) Filed: Dec. 11, 2013

(65) Prior Publication Data

US 2015/0162724 A1 Jun. 11, 2015

(51) Int. Cl.
*H01S 5/00* (2006.01)
*H01S 5/34* (2006.01)
(Continued)

(52) U.S. Cl.
CPC ............... *H01S 5/3401* (2013.01); *H01S 5/187* (2013.01); *H01S 5/34306* (2013.01)

(58) Field of Classification Search
CPC . H01S 2301/163; H01S 5/1032; H01S 5/105; H01S 5/18308; H01S 5/187; H01S 5/4068; H01S 5/4081; H01S 5/423
USPC .................................................. 372/45.012
See application file for complete search history.

(56) References Cited

U.S. PATENT DOCUMENTS

| | | | | |
|---|---|---|---|---|
| 5,206,877 | A | * | 4/1993 | Kahen .............................. 372/96 |
| 5,727,013 | A | * | 3/1998 | Botez et al. ...................... 372/96 |
| 5,936,989 | A | * | 8/1999 | Capasso et al. ........... 372/45.012 |

(Continued)

FOREIGN PATENT DOCUMENTS

FR 2949024 4/2012

OTHER PUBLICATIONS

Maisons et al., Directional single mode quantum cascade laser emission using second-order metal grating coupler, Appl. Phys. Lett., vol. 98, No. 021101, Jan. 10, 2011, pp. 1-3.

(Continued)

*Primary Examiner* — Colleen A Matthews
*Assistant Examiner* — Vu A Vu
(74) *Attorney, Agent, or Firm* — Bell & Manning, LLC

(57) ABSTRACT

Semiconductor lasers comprise a substrate; an active layer configured to generate transverse magnetic (TM) polarized light under an electrical bias; an upper cladding layer; a lower cladding layer; and a distributed feedback (DFB) grating defined by the interface of a layer of metal and a layer of semiconductor under the layer of metal, the interface periodically corrugated in the longitudinal direction of the laser with a periodicity of $\Lambda_{DFB}=m\lambda/(2n_{\it{eff}})$, wherein m>1. The DFB grating is configured such that loss of one or more antisymmetric longitudinal modes of the laser structure via absorption to the DFB grating is sufficiently maximized so as to produce lasing of a symmetric longitudinal mode of the laser with laser emission characterized by a single-lobe beam along each direction defined by the grating diffraction orders corresponding to emission away from the plane of the grating.

22 Claims, 12 Drawing Sheets

(51) Int. Cl.
*H01S 5/343* (2006.01)
*H01S 5/187* (2006.01)

(56) References Cited

U.S. PATENT DOCUMENTS

| | | | |
|---|---|---|---|
| 6,195,381 | B1 | 2/2001 | Botez et al. |
| 6,810,053 | B1 * | 10/2004 | Botez et al. ............... 372/45.01 |
| 6,829,269 | B2 * | 12/2004 | Goodhue et al. ........... 372/43.01 |
| 7,113,526 | B2 * | 9/2006 | Evans et al. ..................... 372/23 |
| 7,349,456 | B2 * | 3/2008 | Bour et al. ................. 372/45.01 |
| 8,213,476 | B1 * | 7/2012 | Wanke et al. ............ 372/45.012 |
| 2006/0215720 | A1 * | 9/2006 | Corzine et al. ............. 372/50.11 |
| 2010/0158063 | A1 * | 6/2010 | Debregeas-Sillard et al. ........................ 372/45.011 |

OTHER PUBLICATIONS

Wan-Hong et al., Design of surface emitting distributed feedback quantum cascade laser with single-lobe farfield pattern and high outcoupling efficiency, Chinese Phys. B, vol. 19, No. 5, 2010, pp. 0542081-1-054208-7.

Finger et al., Analysis of TM-Polarized DFB Laser Structures with Metal Surface Gratings, IEEE Journal of Quantum Electronics, vol. 36, No. 7, Jul. 2000, pp. 780-786.

Pflügl et al., Single-mode surface-emitting quantum-cascade lasers, Appl. Phys. Lett., vol. 86, No. 211102, May 16, 2005, pp. 1-3.

Kumar et al., Surface-emitting distributed feedback terahertz quantum-cascade lasers in metal-metal waveguides, Optics Express, vol. 15, No. 1, Jan. 8, 2007, pp. 113-128.

Lyakh et al., Substrate-emitting, distributed feedback quantum cascade lasers, Appl. Phys. Lett., vol. 91, No. 181116, Oct. 31, 2007, pp. 1-3.

Carras et al., Photonic modes of metallodielectric periodic waveguides in the midinfrared spectral range, Physical Review B, vol. 74, No. 235120, Dec. 26, 2006, pp. 1-4.

Maisons et al., Substrate emitting index coupled quantum cascade lasers using biperiodic top metal grating, Appl. Phys. Lett., vol. 94, No. 151104, Apr. 14, 2009, pp. 1-3.

* cited by examiner

FIG. 3

| Element | Composition | Thickness (μm) |
|---|---|---|
| 212b | InP ($2 \times 10^{19}$ cm$^{-1}$) | 0.05 |
| 212a | InP ($2 \times 10^{16}$ cm$^{-1}$) | 0.188 |
| 210 | Silver | 0.238 |
| 207 | InGaAs | 0.01 |
| 206a | InP ($2 \times 10^{16}$ cm$^{-1}$) | 2.5 |
| 205a | InGaAs | 0.35 |
| 204 | Quantum Cascade Superlattice | 1.5433 |
| 205b | InGaAs | 0.35 |
| 206b | InP ($2 \times 10^{16}$ cm$^{-1}$) | 2 |
| 203 | InP ($1 \times 10^{17}$ cm$^{-1}$) | 1.5 |
| 202 | InP ($4 \times 10^{17}$ cm$^{-1}$) | --- |

SUBSTRATE-EMITTING TRANSVERSE MAGNETIC POLARIZED LASER EMPLOYING A METAL/SEMICONDUCTOR DISTRIBUTED FEEDBACK GRATING FOR SYMMETRIC-MODE OPERATION

REFERENCE TO GOVERNMENT RIGHTS

This invention was made with government support under N68335-11-C-0432 awarded by the US Navy. The government has certain rights in the invention.

BACKGROUND

Quantum cascade lasers (QCL) are semiconductor lasers providing light in the mid- and far-infrared wavelength ranges. QCLs generally involve intersubband transitions in the conduction energy band, which, in turn, leads the generated light to be transverse-magnetic (TM) polarized. Quantum cascade lasers have been made utilizing first-order distributed feedback gratings (DFB). Although first-order DFB QCLs can provide desirable single-mode emission, the lasers are edge-emitting, i.e., laser light is emitted from a cleaved facet. Surface or substrate emission has been achieved using QCLs utilizing second-order distributed feedback gratings, thereby eliminating the need for cleaved facets to emit the light. However, second-order DFB QCLs have generally operated in an antisymmetric longitudinal mode, resulting in a double-lobe, far-field beam pattern. In order to achieve a single-lobe, far-field beam pattern, the second-order DFB gratings may include a π phase shift. Nevertheless, even with a π phase shift, the internal lasing mode of the second-order DFBs QCLs remains antisymmetric longitudinally which, in turn, causes a decrease in efficiency with increasing device cavity length, and low potential for continuous-wave (CW) operation at high output powers.

SUMMARY

Provided herein are semiconductor lasers employing distributed feedback gratings configured for single-mode operation in the symmetric longitudinal mode at virtually no penalty in efficiency.

In one embodiment, a semiconductor laser comprises a substrate; an active layer over the substrate, the active layer configured to generate transverse magnetic polarized light under an electrical bias; an upper cladding layer over the active layer; a lower cladding layer under the active layer; and a distributed feedback grating over the upper cladding layer, the distributed feedback grating defined by the interface of a layer of metal and a layer of semiconductor under the layer of metal, the interface periodically corrugated in the longitudinal direction of the semiconductor laser with a periodicity of $\Lambda_{DFB}=m\lambda/(2n_{eff})$, wherein m>1. The distributed feedback grating is configured such that loss of one or more antisymmetric longitudinal modes of the semiconductor laser via absorption to the distributed feedback grating is sufficiently maximized so as to produce lasing of a symmetric longitudinal mode of the semiconductor laser with laser emission characterized by a single-lobe beam along each direction defined by the grating diffraction orders corresponding to emission away from the plane of the distributed feedback grating.

In another embodiment, a semiconductor laser comprises a substrate; a quantum cascade active layer over the substrate, the quantum cascade active layer configured to generate transverse magnetic polarized light under an electrical bias; an upper cladding layer over the quantum cascade active layer; a lower cladding layer under the quantum cascade active layer; and a second-order distributed feedback grating over the upper cladding layer, the second-order distributed feedback grating defined by the interface of a layer of metal and a layer of semiconductor under the layer of metal, the interface periodically corrugated in the longitudinal direction of the semiconductor laser. The second-order distributed feedback grating is configured such that loss of one or more antisymmetric longitudinal modes of the semiconductor laser via absorption to the second-order distributed feedback grating is sufficiently maximized so as to produce lasing of a symmetric longitudinal mode of the semiconductor laser with laser emission perpendicular to the second-order distributed feedback grating, the laser emission characterized by a single-lobe, far-field beam pattern.

In another embodiment, a semiconductor laser comprises a substrate; a quantum cascade active layer over the substrate, the quantum cascade active layer configured to generate transverse magnetic polarized light under an electrical bias; an upper cladding layer over the quantum cascade active layer; a lower cladding layer under the quantum cascade active layer; and a second-order distributed feedback grating over the upper cladding layer, the second-order distributed feedback grating defined by the interface of a layer of metal and a layer of semiconductor under the layer of metal, the interface periodically corrugated in the longitudinal direction of the semiconductor laser. The second-order distributed feedback grating is configured such that loss of one or more antisymmetric longitudinal modes of the semiconductor laser via absorption to the second-order distributed feedback grating is sufficiently maximized so as to produce lasing of a symmetric longitudinal mode of the semiconductor laser with laser emission perpendicular to the second-order distributed feedback grating, the laser emission characterized by a single-lobe, far-field beam pattern and a wavelength in the range of from about 4 μm to about 5 μm.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings.

FIG. 3 shows the compositions and thicknesses for the semiconductor laser of FIG. 2.

DETAILED DESCRIPTION

Figure 1:
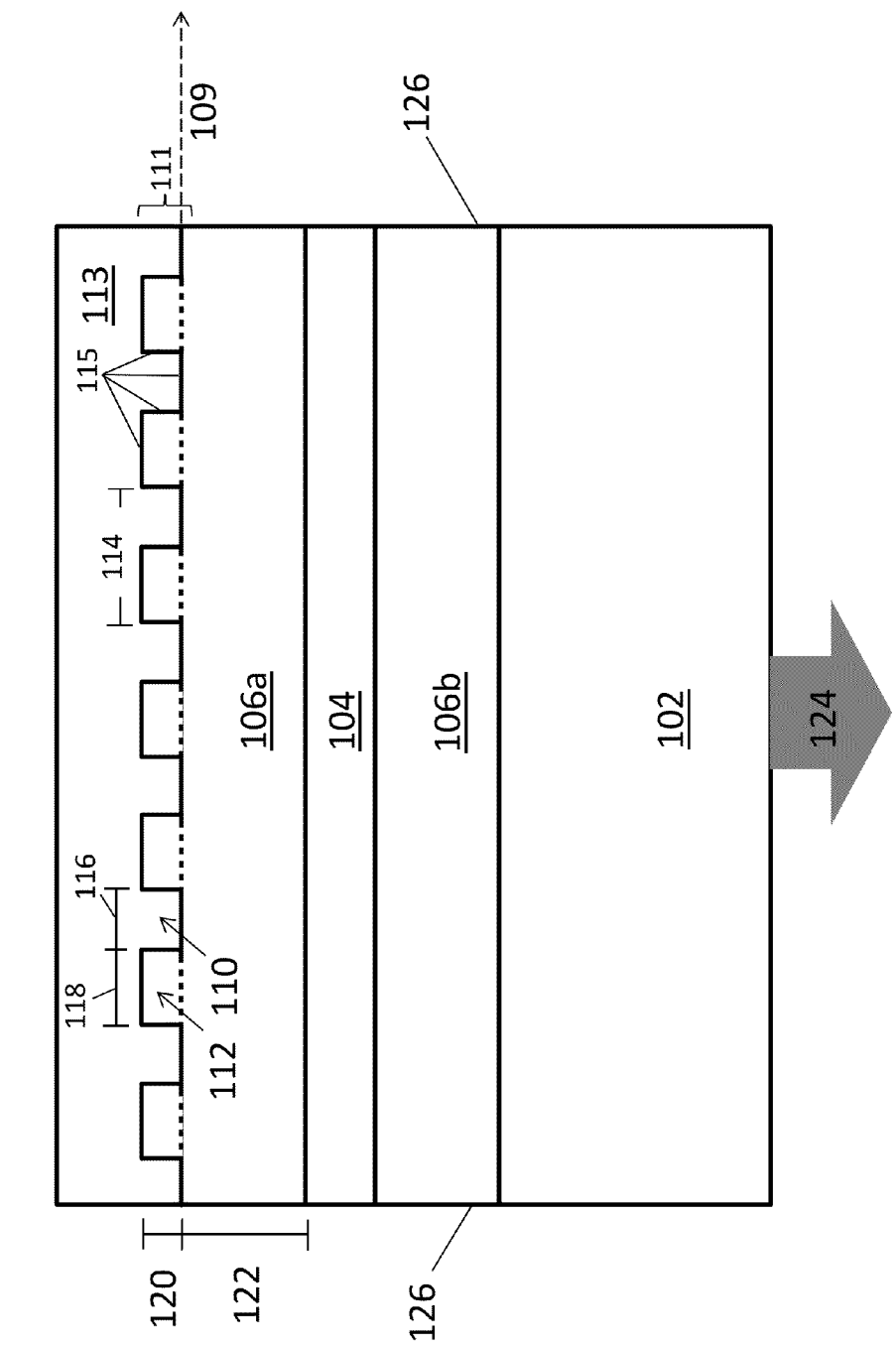
FIG. 1 depicts a longitudinal cross-section of a semiconductor laser according to an illustrative embodiment.

Provided herein are semiconductor lasers employing distributed feedback gratings configured for single-mode operation in the symmetric longitudinal mode.

The approach to conventional surface-emitting quantum cascade lasers utilizing second-order distributed feedback (DFB) gratings has involved optimizing the design of the gratings to improve the outcoupling efficiency of the antisymmetric longitudinal lasing mode and incorporating π phase shifts in the gratings to modify the far-field characteristics of the laser beam. By contrast, the present semiconductor lasers are based on a different approach in which the DFB gratings are configured to suppress the lasing of one or more antisymmetric longitudinal modes in order to favor the lasing of a symmetric longitudinal mode. The present semiconductor lasers are capable of surface emission, with feedback provided by the DFB grating and, if present, distributed-Bragg-reflector (DBR) gratings placed at both ends of the DFB grating. Such a configuration eliminates the need for cleaved facets, which, in turn, improves reproducibility and decreases manufacturing complexity and expense. Since the semiconductor lasers operate in the symmetric longitudinal mode, the laser emission is characterized by one or more single-lobe beams, along each direction of the grating diffraction orders corresponding to emission away from the plane of the DFB grating, thereby eliminating the need for π phase shifters or complex grating geometries such as chirped gratings. Additional advantages of symmetric-longitudinal-mode operation over antisymmetric-longitudinal-mode operation include increased outcoupling efficiency since the outcoupling efficiency scales with the outcoupling grating length, thereby allowing for high-output-power continuous-wave (CW) operation. The present semiconductor lasers find use in a variety of applications including medical imaging, materials processing, remote sensing, infrared countermeasures and free-space optical communications.

In one aspect, a semiconductor laser comprises a substrate, an active layer over the substrate, an upper cladding layer over the active layer, a lower cladding layer under the active layer, and a distributed feedback grating over the upper cladding layer. The active layer is configured to generate transverse magnetic (TM) polarized light under an electrical bias. The distributed feedback grating is defined by the interface of a layer of metal and a layer of semiconductor under the layer of metal, the interface periodically corrugated in the longitudinal direction of the semiconductor laser with a periodicity of $\Lambda_{DFB}=m\lambda/(2n_{eff})$, wherein m (the grating order) is greater than 1; λ is the wavelength of the TM polarized light; and $n_{eff}$ is the effective index of refraction of the distributed feedback grating for TM polarized light having a wavelength vacuum λ. The distributed feedback grating is configured such that loss of one or more antisymmetric longitudinal modes of the semiconductor laser via absorption to the distributed feedback grating is sufficiently maximized so as to produce lasing of a symmetric longitudinal mode of the semiconductor laser with laser emission characterized by a single-lobe beam along each direction defined by the grating diffraction orders corresponding to emission away from the plane of the distributed feedback grating. The laser emitted beam(s) may be diffraction-limited.

A longitudinal cross-sectional view of an exemplary semiconductor laser 100 is shown in FIG. 1. The semiconductor laser 100 comprises a substrate 102, an active layer 104 over the substrate, an upper cladding layer 106a over the active layer, a lower cladding layer 106b under the active layer and a distributed feedback grating over the upper cladding layer.

The distributed feedback grating is defined by the interface (portions of which are indicated by reference number 115) of a layer of metal 113 and a layer of semiconductor 111 underlying the layer of metal 113. The interface of the layer of metal 113 and the layer of semiconductor 111 is periodically corrugated in the longitudinal direction of the semiconductor laser 100 (as indicated by the reference axis 109) and is characterized by a period 114.

Due to the periodic corrugation, the distributed feedback grating may be characterized as comprising metallic grating elements 110 which periodically alternate with semiconducting grating elements 112. The distributed feedback grating may be formed, for example, by depositing a layer of semiconductor on the upper cladding layer 106a, etching the layer of semiconductor to provide the semiconducting grating elements 112 and depositing a layer of metal 113 over the semiconducting elements 112. Because the distributed feedback grating is defined by the entire interface of the layer of metal 113 and the underlying layer of semiconductor 111, in this embodiment, the underlying layer of semiconductor 111 would be considered to include the semiconducting grating elements 112 as well as a portion of the upper cladding layer 106a.

The metallic grating elements 110 are characterized by a width 116 and the semiconducting grating elements 112 are characterized by a width 118. The distributed feedback grating is characterized by a duty cycle, which is defined as the fraction of the period 114 composed of the metallic grating element, i.e., ((the width 116 of a metallic grating element)/(the period 114)). Duty cycles may be reported as a percentage. The distributed feedback grating is further characterized by a grating depth 120. The distributed feedback grating is further characterized by the separation 122 between the distributed feedback grating and the active layer 104. In this embodiment, the separation 122 is equivalent to the thickness of the upper cladding layer 106a.

Optical feedback occurs in the longitudinal direction 109 of the semiconductor laser 100 and laser light 124 is emitted from a surface of the laser, i.e., through the substrate 102. When the distributed feedback grating is a second-order distributed feedback grating, the laser light 124 is emitted perpendicular to the distributed feedback grating. As further described below, for other grating orders, more than one laser beam will be emitted along the directions defined by the grating diffraction orders corresponding to emission away from the plane of the distributed feedback grating, although each will be characterized by a single-lobe, far-field beam pattern.

In the disclosed semiconductor lasers, the values of the grating depth and the duty cycle of the distributed feedback grating are chosen to sufficiently increase absorption loss of one or more (e.g., two) antisymmetric longitudinal modes of the semiconductor laser so as to produce lasing in a symmetric longitudinal mode. In the semiconductor lasers, a TM polarized guided optical mode is defined by the dielectric waveguide formed by the active layer and the surrounding cladding layers. In addition, TM-polarized light antisymmetric plasmonic modes and symmetric plasmonic modes are defined as electromagnetic waves confined to the metal-semiconductor interface of the distributed feedback grating. Coupling of the TM polarized guided optical mode to the antisymmetric plasmonic modes and to the symmetric plasmonic modes constitutes the antisymmetric longitudinal modes and the symmetric longitudinal modes, respectively, in the laser. Such coupling also results in absorption (and thus, loss of energy) of the antisymmetric longitudinal modes and the symmetric longitudinal modes to the distributed feedback grating. The antisymmetric longitudinal modes and symmetric longitudinal modes also experience radiation losses due to outcoupling of light by the metal/semiconductor grating from at least one surface of the semiconductor laser. Ultimately, the longitudinal mode with the smallest overall losses and lowest threshold gain will be favored to lase in the semiconductor laser.

In the semiconductor lasers, values of the grating depth and the duty cycle can be selected such that the coupling of the TM polarized guided optical mode to the antisymmetric plasmonic modes is greater than to the symmetric plasmonic modes, thereby resulting in greater absorption loss of the antisymmetric longitudinal modes of the laser. The ability to selectively increase the absorption losses of the antisymmetric longitudinal modes over the symmetric longitudinal modes means that the semiconductor laser can be made to operate only in the symmetric longitudinal mode. Moreover, values of the grating depth and the duty cycle can be selected such that the coupling of the TM polarized guided optical mode to the antisymmetric plasmonic modes is sufficiently strong that the absorption losses of the antisymmetric longitudinal modes to the distributed feedback grating are maximized. For purposes of the present disclosure, at these values of grating depth and duty cycle and at specific wavelengths, the TM polarized guided optical mode may be considered to be in resonance with the antisymmetric plasmonic modes. The grating depth/duty cycle values leading to these resonances at specific wavelengths may be referred to as resonance values. (In infinite-length semiconductor lasers, there exists one antisymmetric longitudinal mode and one symmetric longitudinal mode and thus, the resonant coupling of the antisymmetric longitudinal mode occurs at only one wavelength value for a given grating depth and duty cycle. In finite-length semiconductor lasers, there exist multiple antisymmetric longitudinal modes and symmetric longitudinal modes and thus, resonant coupling of the antisymmetric longitudinal modes closest to the desired symmetric longitudinal mode occurs at slightly different wavelengths for a given grating depth and duty cycle.) The grating depth/duty cycle values may be set at the values that achieve resonance (i.e., resonance values), but single mode operation in the symmetric longitudinal mode may be possible at other values, provided the absorption losses of the antisymmetric longitudinal modes are sufficient to favor the lasing of the symmetric longitudinal mode, even if such losses are not at their respective maxima. In fact, the optimal values of the grating depth/duty cycle may be those that additionally maximize the outcoupling efficiency of the symmetric longitudinal mode (the percentage of loss of the symmetric longitudinal mode due to surface emission). Such optimal values may be those which are near, but not exactly at, the resonance values of the grating depth/duty cycle.

The particular set of grating depth values and duty cycle values that allows for the suppression of lasing of one or more antisymmetric longitudinal modes in favor of lasing of a symmetric longitudinal mode depends, at least in part, upon the desired wavelength of light (i.e., the wavelength of the TM polarized light generated from the active layer/the wavelength of the laser emission). Simulations of the absorption loss of the antisymmetric longitudinal modes as a function of grating depth and duty cycle, such as those described in the Examples, below, may be used to identify the appropriate set of grating depth values and duty cycle values for a particular semiconductor laser. By way of example only, in some embodiments in which the wavelength of light is in the range of from about 4 μm to about 5 μm, the grating depth is at least about 0.05 μm and the duty cycle is no more than about 0.55. This includes embodiments in which the grating depth is in the range of from about 0.05 μm to about 0.60 μm and the duty cycle is in the range of from about 0.20 to about 0.55. This further includes embodiments in which the grating depth is in the range of from about 0.10 μm to about 0.60 μm and the duty cycle is in the range of from about 0.20 to about 0.50; in which the grating depth is in the range of from about 0.10 μm to about 0.30 μm and the duty cycle is in the range of from about 0.20 to about 0.50; in which the grating depth is in the range of from about 0.15 μm to about 0.50 μm and the duty cycle is in the range of from about 0.40 to about 0.50; or in which the grating depth is in the range of from about 0.20 μm to about 0.30 μm and the duty cycle is in the range of from about 0.35 to about 0.39.

As described above, the distributed feedback grating of the disclosed semiconductor lasers is characterized by a period $\Lambda_{DFB}=m\lambda/(2n_{\text{eff}})$, wherein m (the grating order) is a greater than 1; $\lambda$ is the wavelength of the TM polarized light generated from the active layer; and $n_{\text{eff}}$ is the effective index of refraction of the distributed feedback grating for TM polarized light having a wavelength vacuum $\lambda$. The distributed feedback grating is characterized by m−1 grating diffraction orders corresponding to emission away from the plane of the distributed feedback grating. In some embodiments, m=2, i.e., the distributed feedback grating is a second-order distributed feedback grating. In such embodiments, laser emission is characterized by one single-lobe beam perpendicular to the distributed feedback grating. In some embodiments, m=3 and laser emission is characterized by two single-lobe, off-axis beams (i.e., beams emitted in directions which are away from the plane of the distributed feedback grating, but not perpendicular to the distributed feedback grating). In some embodiments, m=4 and laser emission is characterized by three single-lobe beams, one of which is perpendicular to the distributed feedback grating and two of which are off-axis. Higher grating orders may be used. In some embodiments, m is a non-zero, positive, even integer.

In some embodiments, each of the metallic grating elements in the distributed feedback grating is characterized by substantially the same width and/or each of the semiconducting grating elements in the distributed feedback grating is characterized by substantially the same width (which need not be the same as the width of the metallic grating elements). In some embodiments, the distributed feedback grating is characterized by a single period, i.e., the distributed feedback grating is not biperiodic. In some embodiments, the distributed feedback grating does not comprise a phase shift (e.g., a π phase shift), i.e., the distributed feedback grating does not comprise a space between adjacent grating elements in the grating center corresponding to a phase shift.

The disclosed distributed feedback gratings may be distinguished from primarily semiconductor-based distributed feedback gratings in which metal is formed only atop the peaks of an etched layer of semiconductor. By contrast, the present distributed feedback gratings provide for a periodic corrugation in the longitudinal direction of the interface between a metallic layer and a semiconductor layer.

The profile of the distributed feedback grating along the longitudinal direction of the semiconductor laser, and thus, the shape of the grating elements of the distributed feedback grating, is not particularly limited. Exemplary profiles include rectangular, trapezoidal, sinusoidal and triangular. As described in the Examples, below, different profiles may result in a different set of grating depth values and duty cycle values which allow for suppression of the lasing of antisymmetric longitudinal modes in favor of the lasing of the symmetric longitudinal mode.

The distributed feedback grating may be further characterized by its separation from the active layer in the semiconductor laser. As shown in FIG. 1, a separation 122 may be defined as the distance between the bottoms of the metallic grating elements in the distributed feedback grating and the upper surface of the active layer. The separation may be chosen to increase loss of one or more antisymmetric longitudinal modes of the laser via absorption to the distributed feedback grating and/or to increase the outcoupling efficiency of the symmetric longitudinal mode. In some embodiments, the separation is no more than about 3.5 µm. This includes embodiments in which the separation is no more than about 3.0 µm, no more than about 2.6 µm, no more than about 2.4 µm, or no more than about 1.8 µm. As a practical matter, the desired separation may be achieved by using upper cladding layers having an appropriate thickness.

Various metals may be used for the layer of metal used to form the distributed feedback grating, provided values of grating depth and duty cycle can be selected for the grating which sufficiently increase loss of one or more antisymmetric longitudinal modes of the semiconductor laser via absorption to the distributed feedback grating so as to produce lasing of a symmetric longitudinal mode. Exemplary suitable metals include gold, silver and aluminum. Whether a particular metal will be suitable may depend, at least in part, upon the desired wavelength of light.

The layer of metal used to form the distributed feedback grating may be configured as a multilayer structure comprising multiple layers of different metals. By way of example only, the multilayer structure may comprise a primary layer of metal and an adhesive layer of metal underlying the primary layer of metal. The bulk of the layer of metal may be composed of the primary layer of metal and the adhesive layer of metal (which may be relatively thin) may serve to facilitate electrical contact to the underlying semiconductor layer(s). Suitable metals for the primary layer of metal have been described above and include, e.g., gold, silver and aluminum. Exemplary metals for the adhesive layer include titanium and chromium.

Various semiconductors may be used for the layer of semiconductor used to form the distributed feedback grating. The type of semiconductor is not particularly limiting. Suitable compositions are described below with respect to the composition of other semiconductor layers in the semiconductor laser. Like the layer of metal used to form the distributed feedback grating, the layer of semiconductor may be configured as a multilayer structure comprising multiple layers of different semiconductors. Alternatively, the layer of semiconductor may be composed of a single type of semiconductor, wherein regions (e.g., layers) of the layer of semiconductor comprise different concentrations of a dopant. As discussed above, the distributed feedback grating may be formed by depositing a layer of semiconductor on the uppermost layer of the semiconductor heterostructure (e.g., the upper cladding layer), etching the layer of semiconductor to provide semiconducting grating elements and depositing a layer of metal over the semiconducting grating elements. In such embodiments, the layer of semiconductor underlying the layer of metal (the interface of which provides the diffraction feedback grating) may be considered to include the semiconducting grating elements as well as a portion of the layer on which the layer of semiconductor was deposited (e.g., the upper cladding layer).

The active layer of the disclosed semiconductor lasers, the portion of the semiconductor laser which generates light, is generally configured as a multilayer structure comprising multiple layers of semiconductor. The composition and arrangement of the semiconductor layers within the multilayer structure is not particularly limited, provided the configuration is that which allows the active layer to generate TM polarized light under an electrical bias. The configuration may be characterized by the mechanism by which the light is generated under an electrical bias. In some embodiments, the active layer is a quantum cascade active layer such that light is emitted when electrons within a given energy subband relax between the quantized states of a region formed by certain layers of the multilayer structure. In some embodiments, the active layer is an interband-transition active layer such that light is emitted when electrons and holes recombine within the multilayer structure. Interband-transition active layers comprising tensile-strained quantum wells are capable of generating TM polarized light when forward biased.

Figure 2:
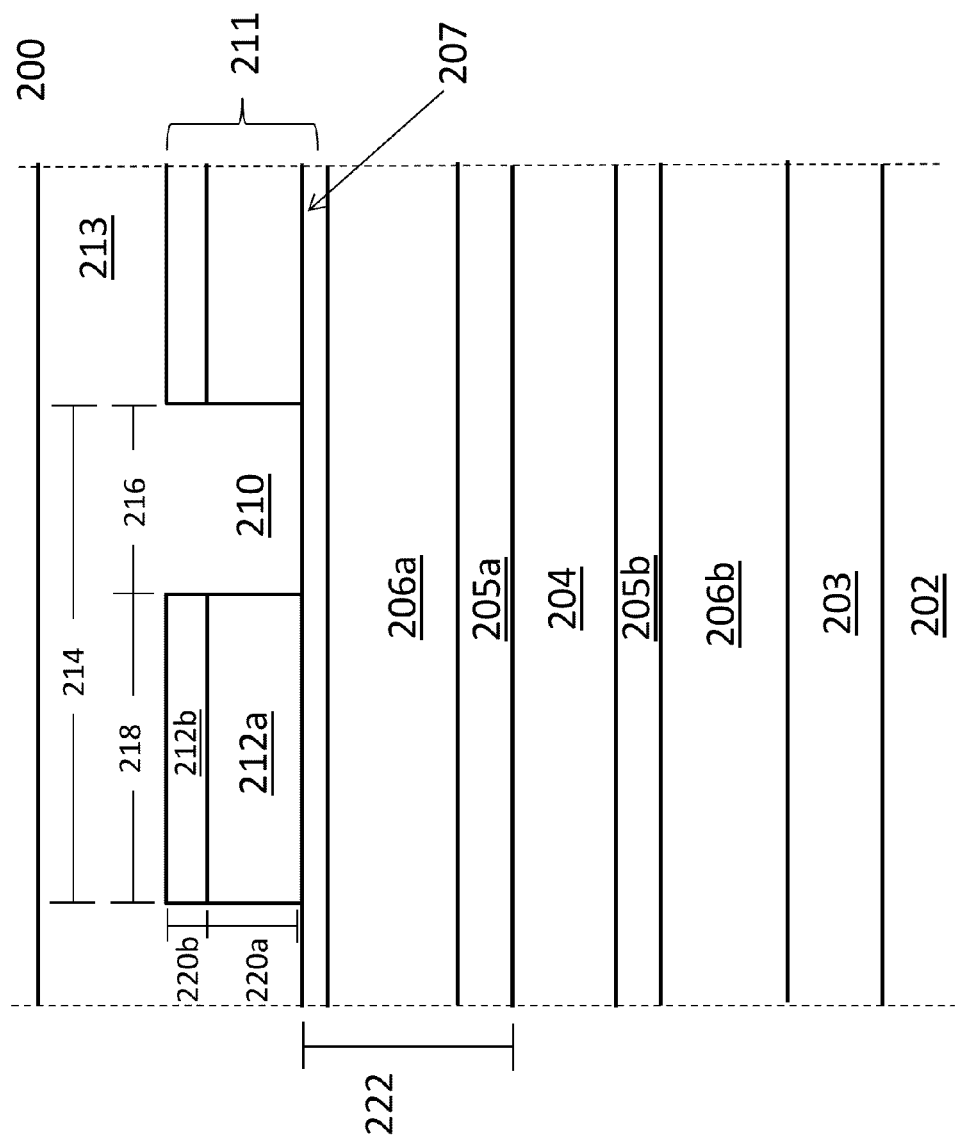
FIG. 2 depicts a portion of a longitudinal cross-section of a semiconductor laser according to an illustrative embodiment.

The disclosed semiconductor lasers may comprise additional layers typically used in semiconductor lasers or otherwise desirable for optimal operation of the laser. By way of example only, the semiconductor laser may comprise a buffer layer between the substrate and the lower cladding layer in order to provide a suitable template on which to grow the desired semiconductor laser. As another example, the semiconductor laser may comprise an optical confinement layer between the active layer and the lower cladding layer and an optical confinement layer between the active layer and the upper cladding layer, the optical confinement layers having a refractive index value higher than the refractive indices of the cladding layers and the active layer. As another example, the semiconductor laser may comprise a stop-etch layer between the upper cladding layer and the distributed feedback grating for controlling the grating depth. As another example, a contact layer may be incorporated at the top portion of the semiconducting grating elements of the distributed feedback grating to provide a low-resistance electrical contact to the overlying layer of metal used to form the distributed feedback grating. Various semiconductors and thicknesses may be used for these additional layers of semiconductor. Exemplary additional layers of semiconductor are shown in FIGS. 2 and 3 and are further described below.

The semiconductors used for the substrate, active layer, cladding layers and additional layers are typically group III/V alloys (e.g., binary, ternary, quaternary alloys), but the choice of group III/V alloy is not particularly limited. By way of example only, the semiconductor lasers may be GaAs-based or InP-based and the compositions of the semiconductor layers may be those that are appropriate for GaAs-based or InP-based systems. The semiconductors may be doped or undoped. Exemplary semiconductors are shown in FIGS. 2 and 3.

As shown in FIG. 1, the longitudinal ends of the semiconductor laser 100 define edge faces 126. In the disclosed semiconductor lasers, the reflectivity of both edge faces is typically substantially the same and the edge faces may be coated with an antireflective coating or otherwise be made to be antireflective. Since the laser emission from the semiconductor lasers is primarily perpendicular to the distributed feedback grating, and feedback for lasing is primarily provided by the distributed feedback grating, cleaved facets at the longitudinal ends of the semiconductor lasers are not necessary.

The disclosed semiconductor lasers may further comprise distributed Bragg grating end reflectors positioned at or near the longitudinal ends of the semiconductor laser and bounding the distributed feedback grating. The distributed Bragg reflector gratings are configured to reflect the TM polarized light generated in the active layer back longitudinally to the distributed feedback grating and are also configured such that current flow is inhibited to flow through them and through the regions of the semiconductor laser underlying them. A variety of known designs may be used for the distributed Bragg reflector gratings, which may be second-order distributed Bragg reflector gratings.

The disclosed semiconductor lasers may further comprise quarter-wave-long phase-matching terminations with highly reflective coatings to provide full, in-phase reflection back to the distributed feedback grating. (See, e.g., Sushil Kumar, Benjamin S. Williams, Qi Qin, Alan W. M. Lee, and Qing Hu, *Optics Express*, Vol. 15, No. 1, 8 Jan. 2007.) Such a configuration may be useful for some THz lasers (e.g., lasers emitting laser light having a wavelength in the range of from about 60 to about 100 μm). Alternatively, the semiconductor lasers may comprise fully light absorbing semiconductor structures bounding the distributed feedback grating. By way of example, such structures may be useful for some THz lasers to prevent unwanted reflections from the longitudinal ends of the laser into the distributed feedback grating region.

Various lengths may be used for the outcoupling grating length (the length of the distributed feedback grating and, if present, the length of distributed Bragg reflector gratings) of the disclosed semiconductor lasers. Because the outcoupling efficiency of the symmetric longitudinal mode scales with outcoupling grating length, the value of the outcoupling grating length of the present semiconductor lasers can be made to be quite large, which is desirable for high-output-power operation. By contrast, although the outcoupling efficiency of the antisymmetric longitudinal modes initially increases with outcoupling grating length to a maximum value, the efficiency ultimately decreases for longer lengths. Thus, the present semiconductor lasers can be made to have outcoupling grating lengths which are larger than would be practical for semiconductor lasers operating in the antisymmetric longitudinal mode. In some embodiments, the outcoupling grating length is at least 0.5 mm. This includes embodiments in which the length is at least 1.0 mm, at least 1.5 mm, at least 2.0 mm, at least 3 mm, at least 6 mm, at least 8 mm, or at least 10 mm. In some embodiments, the outcoupling grating length is in the range of from about 4 mm to about 7 mm.

Depending upon the configuration of the active layer, the semiconductor lasers may emit laser light having a wavelength within a broad range of wavelengths. For example, the semiconductor lasers may emit laser light in the mid- to long-wavelength infrared range (i.e., about 3-20 μm). As another example, the semiconductor lasers may emit laser light in the near infrared range (e.g., 0.78, 0.808, 1.55 μm). As another example, the semiconductor lasers may emit laser light in the THz range (i.e., about 60-300 μm wavelength). In some embodiments, the laser emission from the semiconductor lasers has a wavelength in the range of from about 3 μm to about 4 μm, from about 3 μm to about 5 μm, from about 3.5 μm to about 5 μm, from about 4 μm to about 5 μm or from about 4.5 μm to about 5 μm.

Known methods may be used to form the semiconductor layers of the semiconductor lasers, e.g., metal-organic chemical vapor deposition (MOCVD) or molecular beam epitaxy (MBE). Known methods may be used to form the distributed feedback gratings (e.g., a sequence of holographic interference patterning, wet chemical etching and e-beam evaporation of metal). Similarly, known methods may be used to form distributed Bragg reflector gratings.

A portion of a longitudinal cross-sectional view of another exemplary semiconductor laser 200 is shown in FIG. 2. The semiconductor laser 200 comprises a substrate 202, an active layer 204 over the substrate, an upper cladding layer 206a over the active layer, a lower cladding layer 206b under the active layer, and a distributed feedback grating over the upper cladding layer. The distributed feedback grating is defined by the interface of a layer of metal 213 and a layer of semiconductor 211 underlying the layer of metal 213. The interface of the layer of metal 213 and the layer of semiconductor 211 is periodically corrugated in the longitudinal direction of the semiconductor laser 200 and is characterized by a period 214 of 1.4187 μm. Due to the periodic corrugation, the distributed feedback grating may be characterized as comprising metallic grating elements 210 which periodically alternate with semiconducting grating elements 212a, 212b. Because the distributed feedback grating is defined by the entire interface of the layer of metal 213 and the underlying layer of semiconductor 211, in this embodiment, the underlying layer of semiconductor 211 would be considered to include the semiconducting grating elements 212a, 212b as well as a portion of the stop-etch layer 207. In some embodiments in which the stop-etch layer is very thin (e.g., 0.01 μm), the underlying layer of semiconductor 211 could also be considered to include the stop-etch layer 207 and a portion of the upper cladding layer 206a.

In this embodiment, the semiconducting grating elements are composed of a first layer of semiconductor 212a having a first doping concentration and a second layer of semiconductor 212b having a second doping concentration. The metallic grating elements 210 are characterized by a width 216 of 0.539 μm and the semiconducting grating elements 212a, 212b are characterized by a width 218 of 0.880 μm. The duty cycle of the distributed feedback grating is 0.539 μm/1.4187 μm=0.38. The distributed feedback grating is further characterized by a grating depth, which in this embodiment, is the sum of the depths 220a and 220b. The distributed feedback grating is further characterized by the separation 222 between the distributed feedback grating and the active layer 204.

In this embodiment, the semiconductor laser comprises additional layers of semiconductor, including a buffer layer 203 between the lower cladding layer 206b and the substrate 202; an upper optical confinement layer 205a between the upper cladding layer 206a and the active layer 204; a lower optical confinement layer 205b between the active layer 204 and the lower cladding layer 206b; and a stop-etch layer 207 underlying the metallic grating elements 210 and the semiconducting grating elements 212a,212b and overlying the upper cladding layer 206a.

Optical feedback occurs in the longitudinal direction of the semiconductor laser 200 and laser emission is perpendicular to the distributed feedback grating. The active layer is configured as a multilayer quantum cascade structure providing laser emission at a wavelength of about 4.6 μm.

FIG. 3 shows the compositions and thicknesses of the layers of the semiconductor laser 200. As described above, different compositions, doping concentrations and thicknesses for each of the material layers of the semiconductor laser may be used.

The disclosed semiconductor lasers will be understood more readily by reference to the following examples, which are provided by way of illustration and are not intended to be limiting.

EXAMPLES

Simulations of semiconductor lasers having configurations similar to those shown in FIGS. 1-3 were conducted. Simulations were performed by two methods: full-wave electromagnetic simulation using the COMSOL software package and coupled-mode analysis for large-index-step gratings. (See, R. Noll and S. Macomber, IEEE JQE, 26, 456 (1990) and N. Finger, W. Schrenk, and E. Gornik, IEEE Journal of Quantum Electronics, Vol. 36, No. 7, 780 (2000).)

Figure 4:
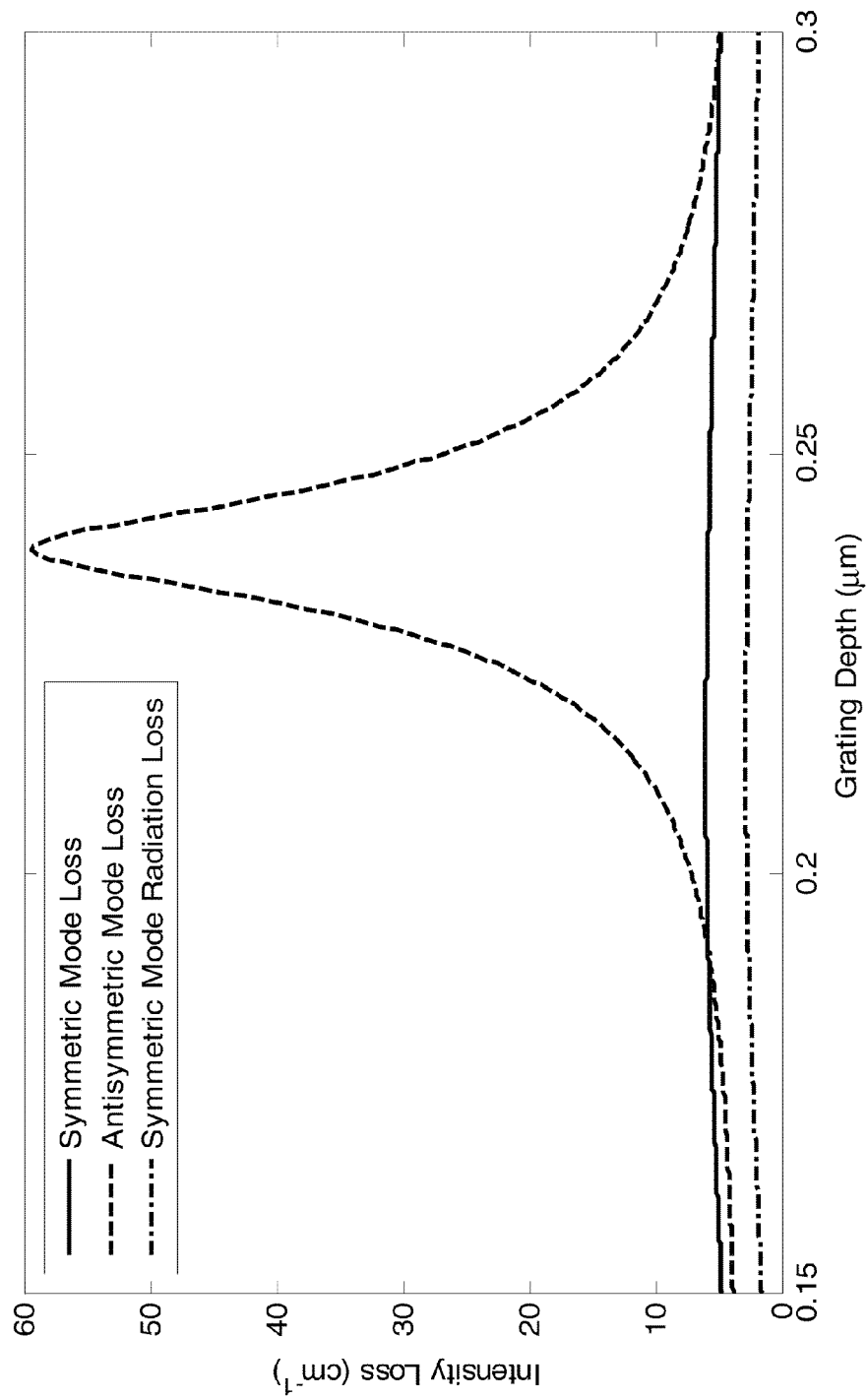
FIG. 4 shows a plot of loss as a function of grating depth in a semiconductor laser according to an illustrative embodiment.
Figure 5A:
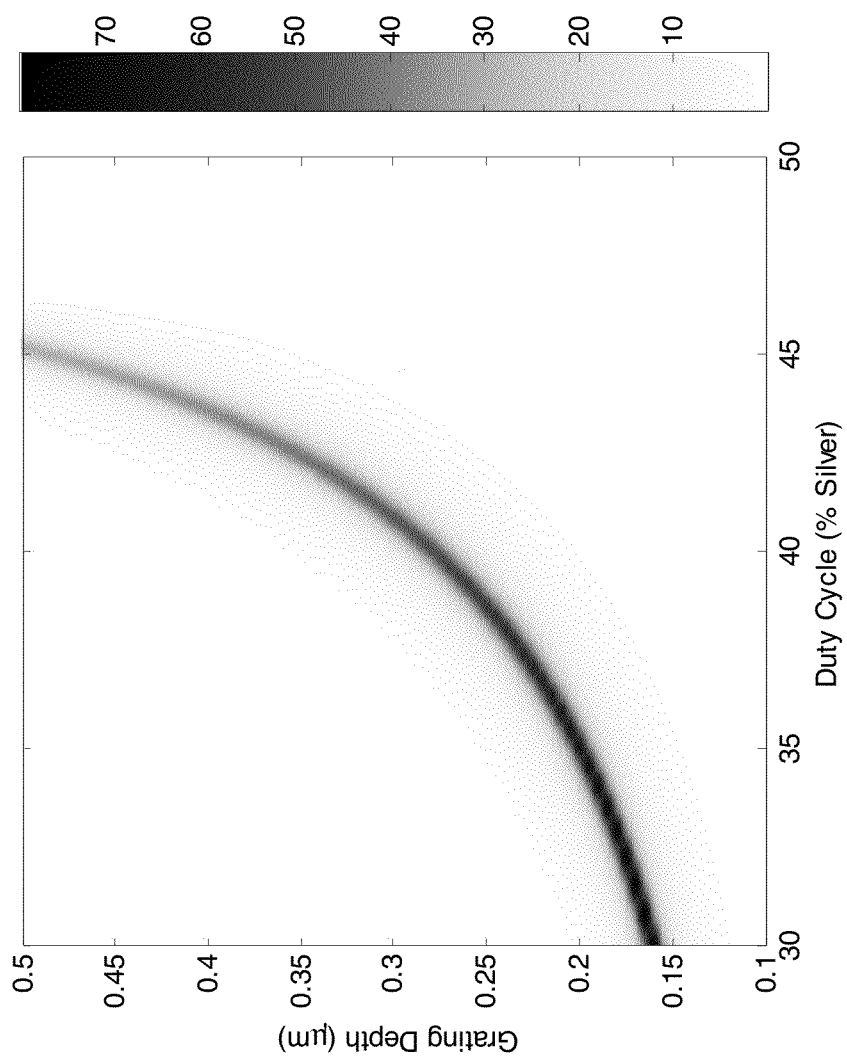
FIG. 5 shows a plot of loss of the antisymmetric longitudinal mode (A) and the symmetric longitudinal mode (B) in an infinite-length semiconductor laser according to an illustrative embodiment.
Figure 5B:
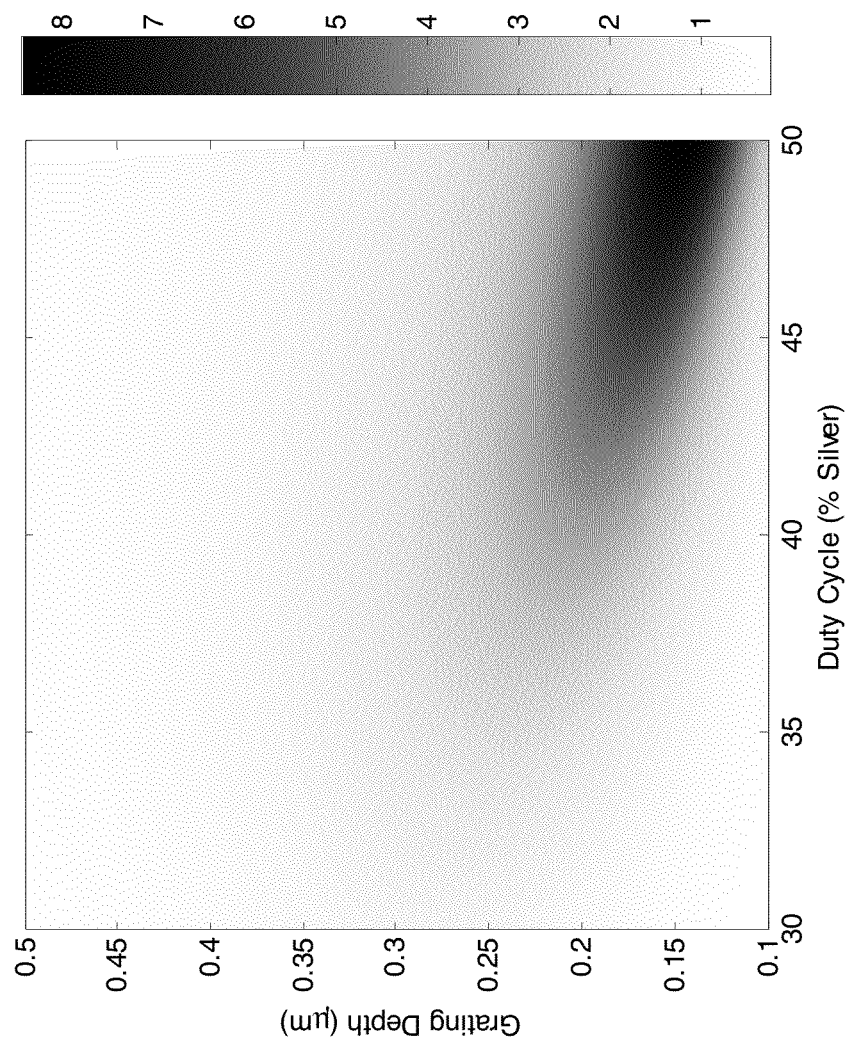
Figure 6:
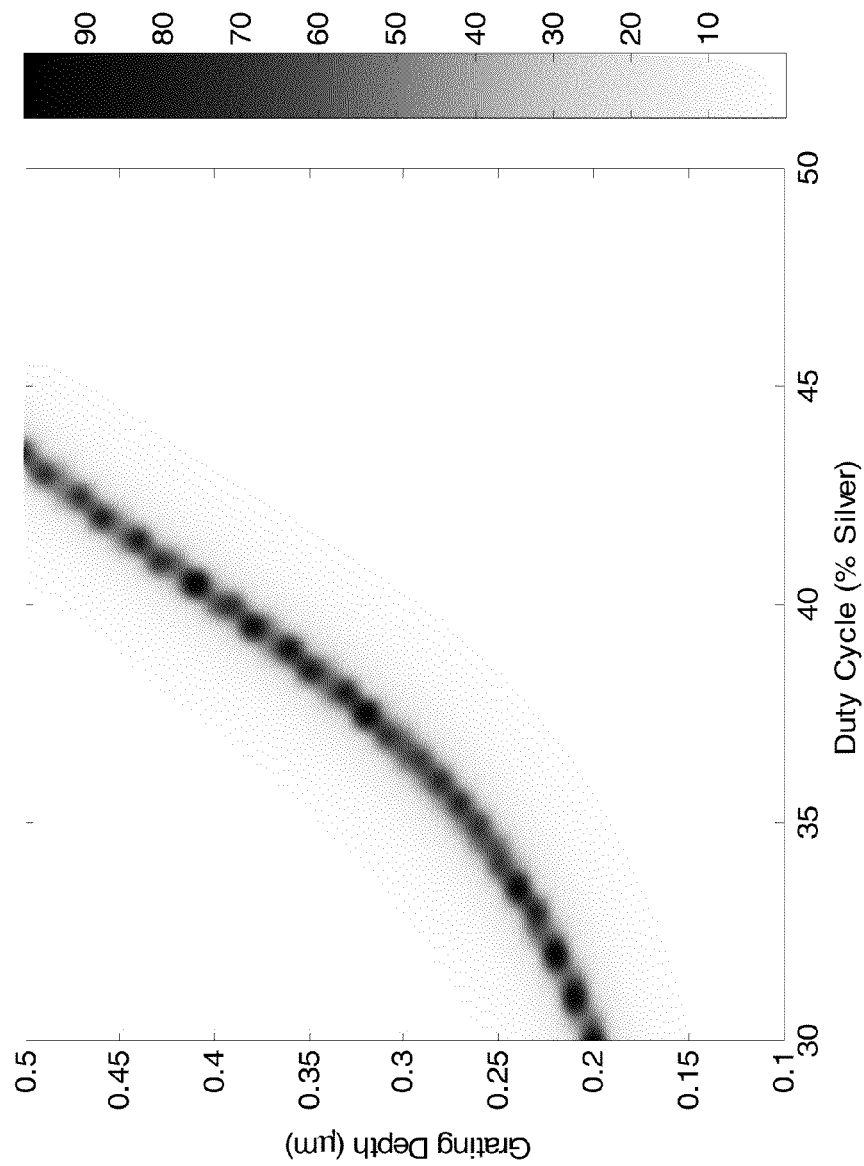
FIG. 6 shows a plot of loss of the antisymmetric longitudinal mode in an infinite-length semiconductor laser according to an illustrative embodiment.

Results of the simulations for infinite-length distributed feedback gratings are shown in FIGS. 4-6. FIG. 4 is a plot of the loss for the exemplary semiconductor laser shown in FIGS. 2 and 3 as a function of the grating depth of the distributed feedback grating at a fixed grating duty cycle. The semiconductor laser was InP-based, with a quantum cascade active layer and a distributed feedback grating comprising silver metallic elements and InP semiconductor elements. The distributed feedback grating had a rectangular profile and a duty cycle of 38%. The laser emission was about 4.6 µm. In addition, the layer of metal defining the distributed feedback grating comprised a primary layer of silver and an adhesive layer of titanium (2 nm) atop the semiconducting grating elements and an adhesive layer of titanium (2 nm) atop the stop-etch layer between the semiconducting grating elements. Thus, in the region atop the semiconducting grating elements and atop the stop-etch layer between the semiconducting grating elements the layer of metal was configured as a multilayer structure. The single-dashed curve represents loss of the antisymmetric longitudinal mode (the non-radiating mode) primarily via absorption to the distributed feedback grating and in small part, losses associated with the quantum cascade active layer. (Of the peak loss of about 60 $cm^{-1}$, the losses associated with the quantum cascade active layer were about 3 $cm^{-1}$.) The solid curve represents loss of the symmetric longitudinal mode (the radiating mode) due to laser emission through the substrate, losses associated with the quantum cascade active layer and, in small part, loss via absorption to the distributed feedback grating. (The loss via absorption to the distributed feedback grating was less than 1 $cm^{-1}$.) The double-dashed curve represents loss of the symmetric longitudinal mode due only to laser emission through the substrate. The antisymmetric longitudinal mode experiences extremely high absorption losses over a relatively narrow range of grating depth values. At the same time, over these grating depth values, a significant part of the loss of the symmetric longitudinal mode is due to laser emission through the substrate, rather than absorption to the distributed feedback grating. Thus, the outcoupling efficiency of the symmetric longitudinal mode is extremely high.

FIG. 5A is an intensity plot of the absorption loss of the antisymmetric longitudinal mode from the exemplary semiconductor laser of FIGS. 2, 3 and 4 as a function of both the grating depth and the duty cycle. The plot shows that there exists a set of grating depth values and duty cycle values for which absorption loss is extremely high. The values of grating depth and duty cycle for which the absorption loss is at a maximum may be considered to be resonance values for infinite-length gratings. For comparison, FIG. 5B is an intensity plot of loss (due both to laser emission through the substrate, the quantum cascade active layer and absorption to the distributed feedback grating) of the symmetric longitudinal mode for the same laser. At the resonance values of grating depth and duty cycle (i.e., values at which the absorption loss of the antisymmetric longitudinal mode is at its maximum) as well as values near resonance, the loss of the symmetric longitudinal mode is relatively low. Moreover, as has been shown in FIG. 4 and described above, a significant part of the symmetric longitudinal mode loss is due to laser emission rather than absorption to the diffraction feedback grating. In addition, intensity plots show that there is a separate set of grating depth and duty cycle values which maximizes the absorption loss of the symmetric longitudinal mode. However, although the threshold gain of the symmetric longitudinal mode increases at such values, the absorption loss of the antisymmetric longitudinal mode significantly decreases. Thus, the suppression of lasing of the antisymmetric longitudinal mode in favor of the symmetric longitudinal mode is less effective. FIGS. 5A and 5B demonstrate the ability to sufficiently increase the loss of the antisymmetric longitudinal mode of an infinite-length distributed feedback semiconductor laser via absorption to the distributed feedback grating so as to produce lasing of a symmetric longitudinal mode with high outcoupling efficiency.

FIG. 6 is an intensity plot of the absorption loss of the antisymmetric longitudinal mode from a semiconductor laser configured as in FIGS. 2, 3 and 4, except that the profile of the distributed feedback grating was trapezoidal. The plot shows that there exists a set of grating depth values and duty cycle values for which absorption loss is extremely high. The particular set of values, however, differs slightly from those shown in FIG. 5A, due to the different profile of the distributed feedback grating.

Results of the simulations for finite-length distributed feedback gratings are shown in FIGS. 7-10. The configuration and composition of the semiconductor laser was as shown in FIGS. 2 and 3 and as described above. In addition, the layer of metal defining the distributed feedback grating comprised a primary layer of silver and an adhesive layer of titanium (2 nm) atop the semiconducting grating elements and an adhesive layer of titanium (2 nm) atop the stop-etch layer between the semiconducting grating elements. Thus, in the region atop the semiconducting grating elements and atop the stop-etch layer between the semiconducting grating elements the layer of metal was configured as a multilayer structure. The semiconductor laser was terminated on its longitudinal ends by second-order distributed Bragg reflector gratings, each consisting of 900 periods, each having a length of 1.277 mm. The distributed feedback grating of the semiconductor laser consisted of 1800 periods and had a length of 2.553 mm. The entire semiconductor laser consisted of 3600 periods and had a length of 5.107 mm. For FIGS. 7-9, the grating height and duty cycles have fixed values of 0.238 µm and 38%, respectively.

Figure 7:
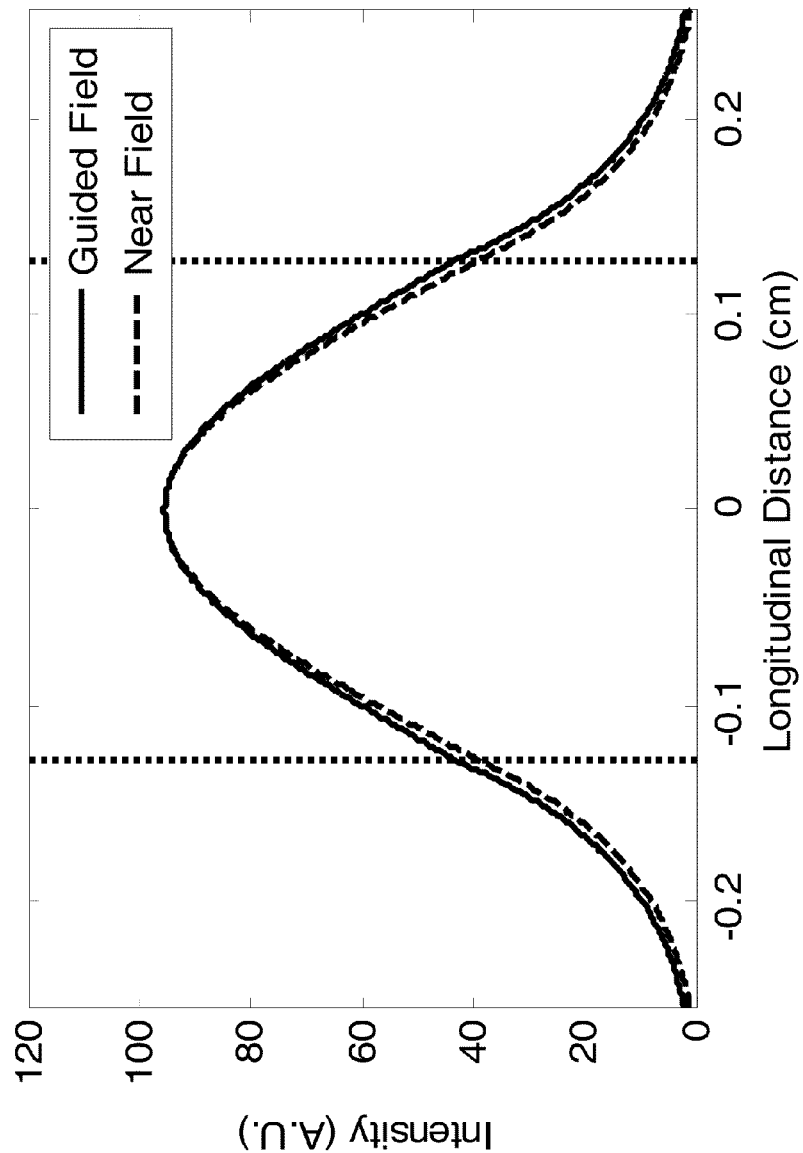
FIG. 7 shows the guided-field intensity envelope and near-field intensity patterns for the symmetric longitudinal mode (the lasing mode) of a finite-length semiconductor laser according to an illustrative embodiment.
Figure 8A:
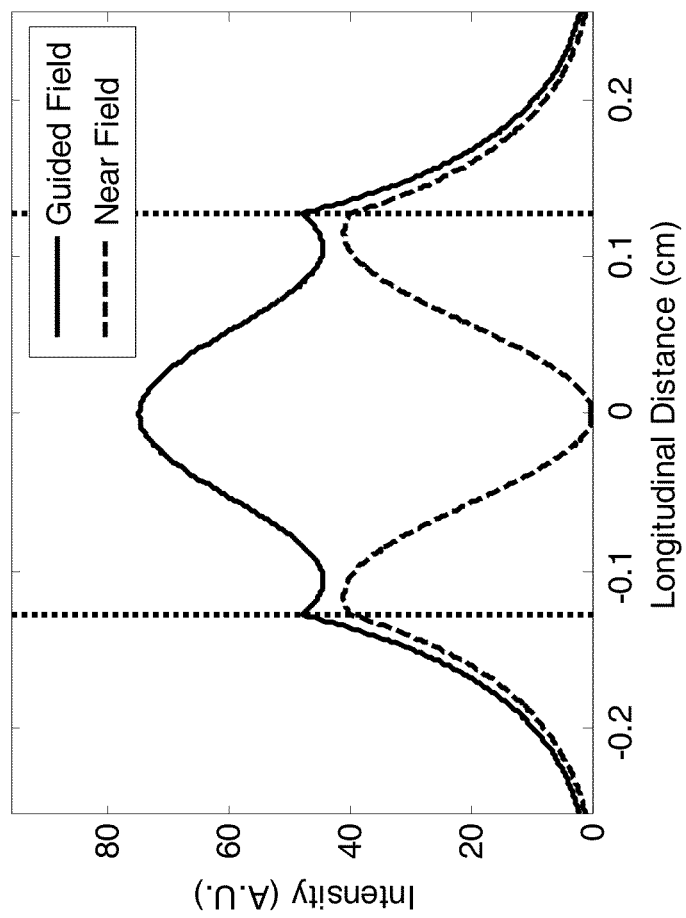
FIGS. 8A and B show the guided-field intensity envelope and near-field intensity patterns for two antisymmetric longitudinal modes (the competing modes) of the semiconductor laser of FIG. 7.
Figure 8B:
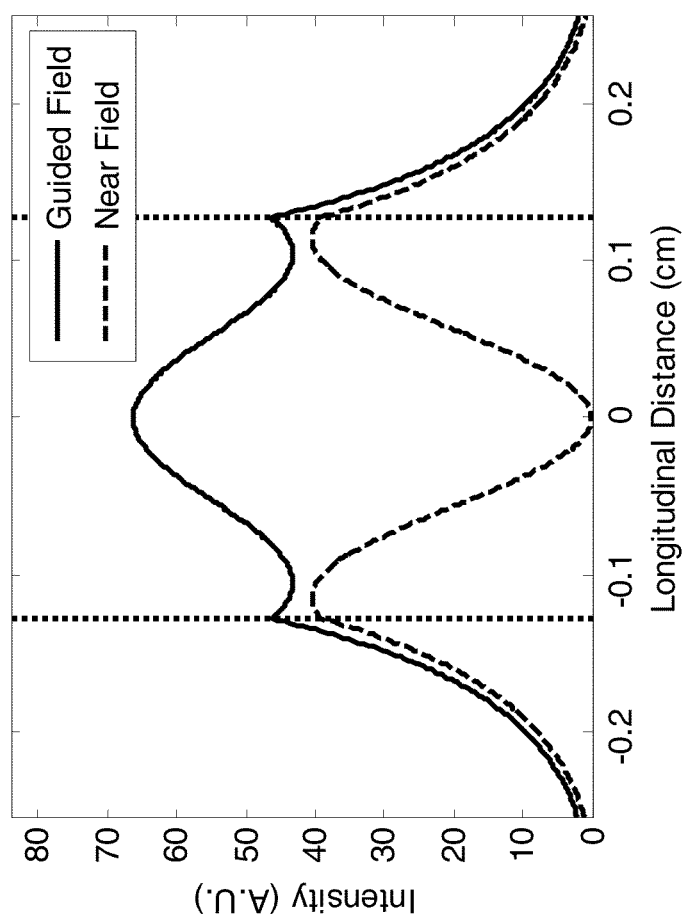
Figure 9:
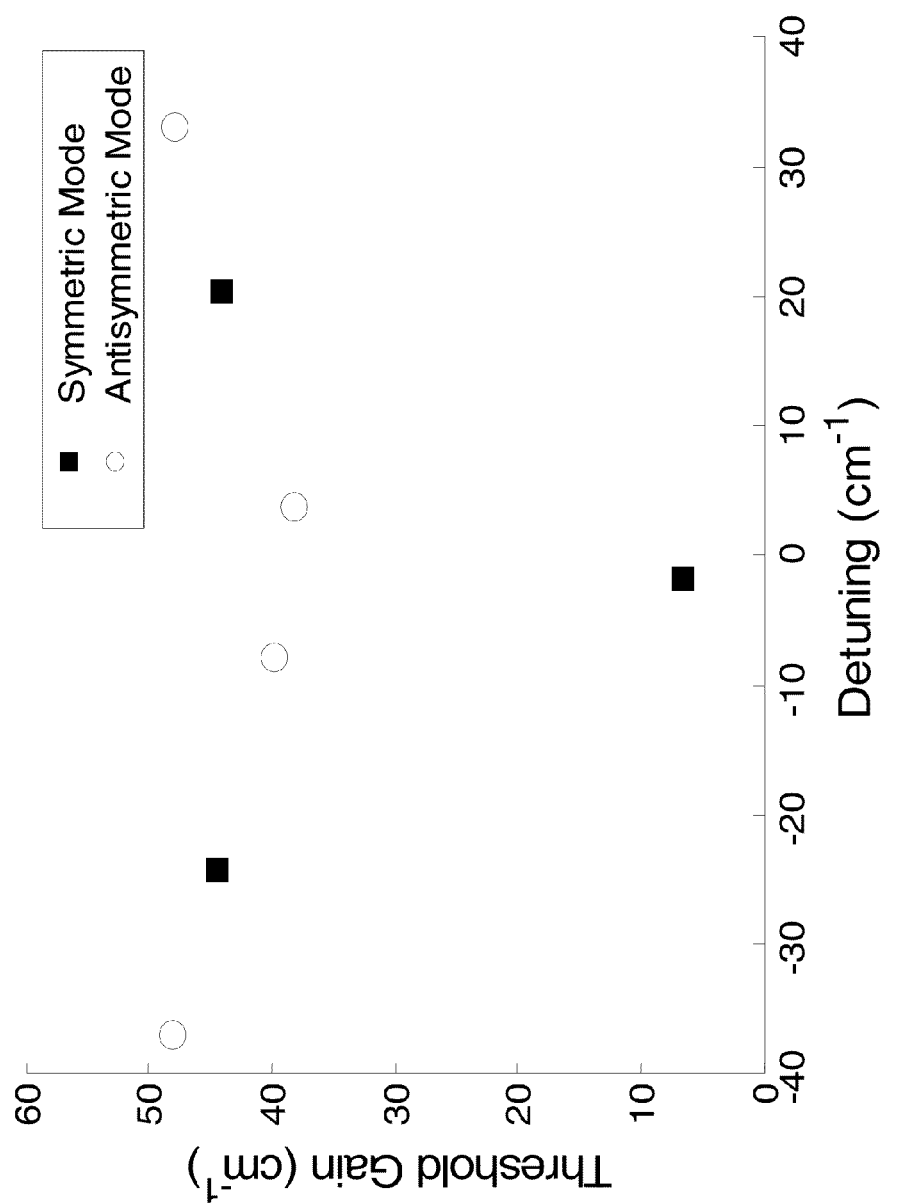
FIG. 9 shows the threshold gain of various longitudinal modes, as a function of detuning from a reference wavelength of 4.6 µm, for the semiconductor laser of FIG. 7.
Figure 10:
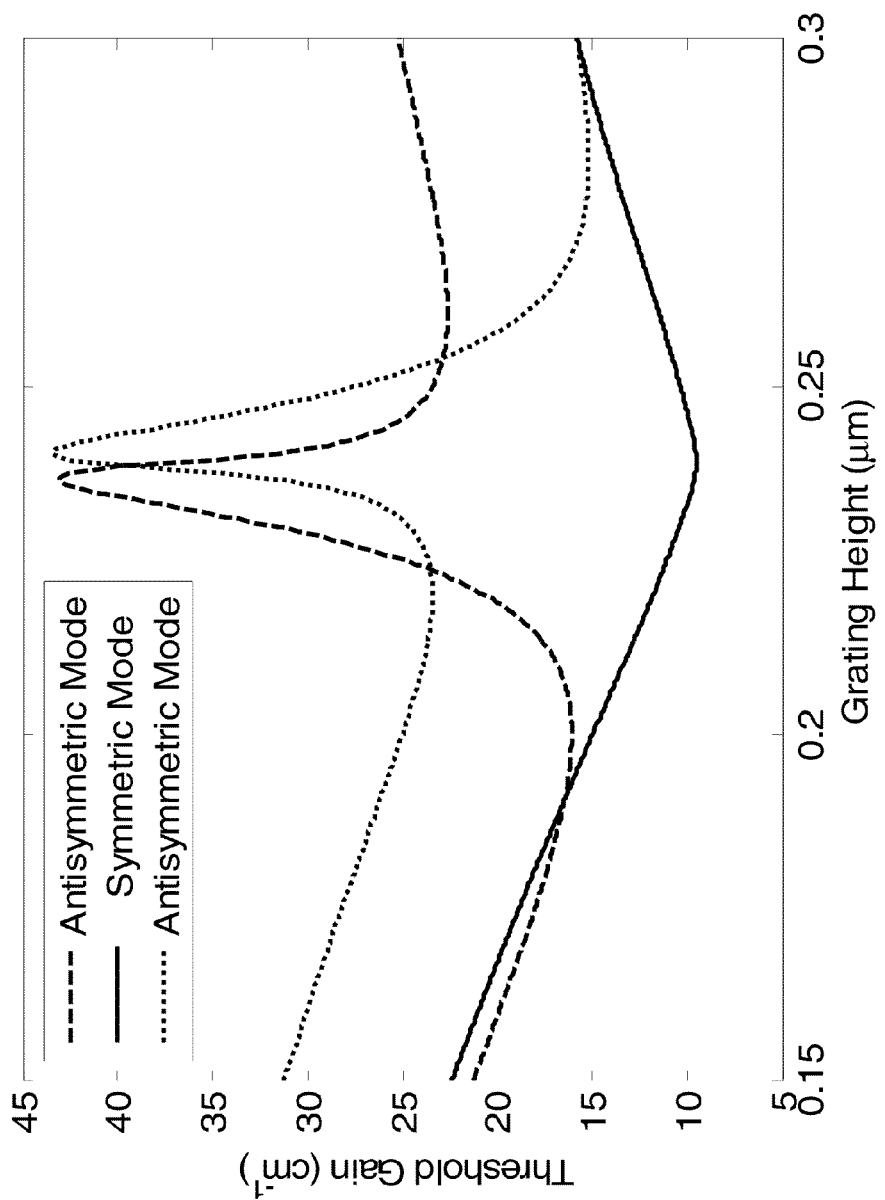
FIG. 10 shows the threshold gain for the symmetric longitudinal mode and the two competing antisymmetric longitudinal modes as a function of grating height for the semiconductor laser of FIG. 7.

FIG. 7 shows the guided-field intensity envelope pattern (solid curve) and near-field intensity pattern (dashed curve) for the symmetric longitudinal mode (the lasing mode) of the semiconductor laser. FIGS. 8A and B show the guided-field intensity envelope pattern (solid curves) and near-field intensity pattern (dashed curves) for two antisymmetric longitudinal modes (the competing modes) of the semiconductor laser. The threshold gain as a function of detuning from the reference wavelength of 4.6 µm is shown in FIG. 9, illustrating that single-mode laser operation in a symmetric longitudinal mode is strongly favored. The threshold gain for the symmetric longitudinal mode (solid curve) and the two competing antisymmetric longitudinal modes (dashed curves) as a function of grating height at 38% duty cycle is shown in FIG. 10. Each of two competing antisymmetric longitudinal modes reaches maximum threshold gain at a grating depth and wavelength value that corresponds to maximum absorption loss at its respective resonance value. Over a relatively large range in grating height variation (0.22-0.26 µm) the discrimination between the symmetric longitudinal mode and the antisymmetric longitudinal modes is larger than 10 cm$^{-1}$ which ensures laser operation in only the symmetric longitudinal mode.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A semiconductor laser comprising:
   (a) a substrate;
   (b) an active layer over the substrate, the active layer configured to generate transverse magnetic (TM) polarized light under an electrical bias;
   (c) an upper cladding layer over the active layer;
   (d) a lower cladding layer under the active layer, wherein the active layer, the upper cladding layer and the lower cladding layer define a TM polarized guided optical mode; and
   (e) a distributed feedback grating over the upper cladding layer, the distributed feedback grating defined by the interface of a layer of metal and a layer of semiconductor under the layer of metal, the interface periodically corrugated in the longitudinal direction of the semiconductor laser with a periodicity of $\Lambda_{DFB}=m\lambda/(2n_{eff})$, wherein m>1, wherein the interface supports one or more antisymmetric plasmonic modes,
   and further wherein the distributed feedback grating is configured such that coupling of the TM polarized guided optical mode to the antisymmetric plasmonic modes, thereby generating one or more antisymmetric longitudinal modes of the semiconductor laser, is sufficiently maximized so as to result in absorption loss of the antisymmetric longitudinal modes to the distributed feedback grating sufficient to produce lasing of a symmetric longitudinal mode of the semiconductor laser with laser emission characterized by a single-lobe beam along each direction defined by the grating diffraction orders corresponding to emission away from the plane of the distributed feedback grating.

2. The semiconductor laser of claim 1, wherein m=2 and the distributed feedback grating is a second-order distributed feedback grating and the laser emission is perpendicular to the distributed feedback grating.

3. The semiconductor laser of claim 1, wherein the value of the grating depth and the value of the duty cycle of the distributed feedback grating are substantially near the values for which the TM polarized guided optical mode of the semiconductor laser is in resonance with the antisymmetric plasmonic modes of the distributed feedback grating.

4. The semiconductor laser of claim 1, wherein the active layer is configured as a quantum cascade active layer.

5. The semiconductor laser of claim 1, wherein the active layer is configured as an interband-transition active layer comprising tensile-strained quantum wells.

6. The semiconductor laser of claim 1, further comprising distributed Bragg reflector gratings bounding the distributed feedback grating.

7. The semiconductor laser of claim 1, wherein the distributed feedback grating does not comprise a $\pi$ phase shift.

8. The semiconductor laser of claim 1, wherein the edge faces defined by the longitudinal ends of the semiconductor laser have substantially the same reflectivity.

9. The semiconductor laser of claim 8, wherein the edge faces are antireflective.

10. The semiconductor laser of claim 1, wherein the distributed feedback grating comprises metallic grating elements which periodically alternate with semiconducting grating elements, wherein the semiconducting grating elements do not substantially absorb the TM polarized guided optical mode.

11. A semiconductor laser comprising:
    (a) a substrate;
    (b) a quantum cascade active layer over the substrate, the quantum cascade active layer configured to generate transverse magnetic (TM) polarized light under an electrical bias;
    (c) an upper cladding layer over the quantum cascade active layer;
    (d) a lower cladding layer under the quantum cascade active layer, wherein the quantum cascade active layer, the upper cladding layer and the lower cladding layer define a TM polarized guided optical mode; and
    (e) a second-order distributed feedback grating over the upper cladding layer, the second-order distributed feedback grating defined by the interface of a layer of metal and a layer of semiconductor under the layer of metal, the interface periodically corrugated in the longitudinal direction of the semiconductor laser, wherein the interface supports one or more antisymmetric plasmonic modes,
    wherein the second-order distributed feedback grating is configured such that coupling of the TM polarized guided optical mode to the antisymmetric plasmonic modes, thereby generating one or more antisymmetric longitudinal modes of the semiconductor laser, is sufficiently maximized so as to result in absorption loss of the antisymmetric longitudinal modes to the distributed feedback grating sufficient to produce lasing of a symmetric longitudinal mode of the semiconductor laser with laser emission perpendicular to the second-order distributed feedback grating, the laser emission characterized by a single-lobe, far-field beam pattern.

12. The semiconductor laser of claim 11, further comprising second-order distributed Bragg reflector gratings bounding the distributed feedback grating.

13. The semiconductor laser of claim 11, wherein the distributed feedback grating comprises metallic grating elements which periodically alternate with semiconducting grating elements, wherein the semiconducting grating elements do not substantially absorb the TM polarized guided optical mode.

14. A semiconductor laser comprising:
(a) a substrate;
(b) a quantum cascade active layer over the substrate, the quantum cascade active layer configured to generate transverse magnetic (TM) polarized light under an electrical bias;
(c) an upper cladding layer over the quantum cascade active layer;
(d) a lower cladding layer under the quantum cascade active layer, wherein the quantum cascade active layer, the upper cladding layer and the lower cladding layer define a TM polarized guided optical mode; and
(e) a second-order distributed feedback grating over the upper cladding layer, the second-order distributed feedback grating defined by the interface of a layer of metal and a layer of semiconductor under the layer of metal, the interface periodically corrugated in the longitudinal direction of the semiconductor laser, wherein the interface supports one or more antisymmetric plasmonic modes,
wherein the second-order distributed feedback grating is configured such that coupling of the TM polarized guided optical mode to the antisymmetric plasmonic modes, thereby generating one or more antisymmetric longitudinal modes of the semiconductor laser, is sufficiently maximized so as to result in absorption loss of the antisymmetric longitudinal modes to the distributed feedback grating sufficient to produce lasing of a symmetric longitudinal mode of the semiconductor laser with laser emission perpendicular to the second-order distributed feedback grating, the laser emission characterized by a single-lobe, far-field beam pattern and a wavelength in the range of from about 4 µm to about 5 µm.

15. The semiconductor laser of claim 14, wherein the layer of metal comprises gold or silver.

16. The semiconductor laser of claim 14, wherein the value of the grating depth and the value of the duty cycle of the distributed feedback grating are substantially near the values for which the TM polarized guided optical mode of the semiconductor laser is in resonance with the antisymmetric plasmonic modes of the distributed feedback grating.

17. The semiconductor laser of claim 14, wherein the value of the grating depth of the distributed feedback grating is in the range of from about 0.10 µm to about 0.60 µm and the value of the duty cycle of the distributed feedback grating is in the range of from about 0.20 to about 0.50.

18. The semiconductor laser of claim 14, wherein the separation of the distributed feedback grating from the quantum cascade active layer is no more than about 3.5 µm.

19. The semiconductor laser of claim 14, wherein the layer of metal comprises gold or silver, the semiconductor laser is InP-based, and the value of the grating depth of the distributed feedback grating is in the range of from about 0.10 µm to about 0.60 µm and the value of the duty cycle of the distributed feedback grating is in the range of from about 0.20 to about 0.50.

20. The semiconductor laser of claim 19, wherein the separation of the distributed feedback grating from the quantum cascade active layer is no more than about 3.5 µm.

21. The semiconductor laser of claim 20, further comprising second-order distributed Bragg reflector gratings bounding the distributed feedback grating.

22. The semiconductor laser of claim 14, wherein the distributed feedback grating comprises metallic grating elements which periodically alternate with semiconducting grating elements, wherein the semiconducting grating elements do not substantially absorb the TM polarized guided optical mode.

* * * * *